United States Patent
Sinkunas

(10) Patent No.: US 6,168,070 B1
(45) Date of Patent: Jan. 2, 2001

(54) METHOD FOR SOLDERING DPAK-TYPE ELECTRONIC COMPONENTS TO CIRCUIT BOARDS

(75) Inventor: Peter Joseph Sinkunas, Canton, MI (US)

(73) Assignee: Visteon Global Technologies, Inc., Dearborn, MI (US)

( * ) Notice: Under 35 U.S.C. 154(b), the term of this patent shall be extended for 0 days.

(21) Appl. No.: 09/172,047

(22) Filed: Oct. 14, 1998

(51) Int. Cl.[7] .......................... B23K 31/00; B23K 31/02; B23K 26/00
(52) U.S. Cl. .................. 228/179.1; 219/121.63; 219/121.64
(58) Field of Search .................... 228/179.1; 219/121.64, 219/121.63

(56) References Cited

U.S. PATENT DOCUMENTS

| 4,453,662 | * | 6/1984 | Russell, II | 228/56 |
| 4,926,022 |   | 5/1990 | Freedman | 219/121.63 |
| 4,961,125 | * | 10/1990 | Jordan et al. | 361/383 |
| 4,963,714 |   | 10/1990 | Adamski et al. | 219/121.63 |
| 5,122,635 |   | 6/1992 | Knödler et al. | 219/121.63 |
| 5,124,175 | * | 6/1992 | Miracky et al. | 427/98 |
| 5,236,117 | * | 8/1993 | Roane et al. | 228/180.21 |
| 5,241,445 | * | 8/1993 | Karasawa | 361/104 |
| 5,298,715 |   | 3/1994 | Chalco et al. | 219/121.64 |
| 5,421,504 | * | 6/1995 | Spirig | 228/41 |
| 5,484,979 | * | 1/1996 | Gao | 219/121.64 |
| 5,495,089 |   | 2/1996 | Freedman et al. | 219/121.64 |
| 5,525,777 | * | 6/1996 | Kukuljan | 219/121.83 |
| 5,614,113 |   | 3/1997 | Hwang et al. | 219/121.64 |
| 5,653,381 | * | 8/1997 | Azdasht | 228/254 |
| 5,763,854 | * | 6/1998 | Dittman et al. | 219/121.63 |
| 5,821,494 | * | 10/1998 | Albrecht et al. | 21/121.64 |
| 5,917,704 | * | 5/1999 | Trublowski et al. | 361/705 |
| 5,920,462 | * | 7/1999 | Glovatsky et al. | 361/760 |

* cited by examiner

Primary Examiner—Patrick Ryan
Assistant Examiner—Zidia T. Pittman
(74) Attorney, Agent, or Firm—Leslie C. Hodges

(57) ABSTRACT

There is disclosed herein a method for soldering an electronic component 10 having a heatspreader 14 on a bottom surface thereof and at least one lead 18 (e.g., a DPAK-type component) to a circuit board 30 having a heatspreader mounting pad 32 and at least one lead mounting pad 34, comprising the steps of: (a) depositing solder paste 36 on the heatspreader mounting pad 32 and on each of the at least one lead mounting pad 34; (b) placing the electronic component 10 on the circuit board 30 such that the heatspreader 14 rests atop the heatspreader mounting pad 32 and each lead 18 rests atop a respective one of the at least one lead mounting pad 34; (c) directing a laser energy beam 42 from a diode laser 40 at the heatspreader 14 and/or at the heatspreader mounting pad 32 for a first predetermined length of time, thereby heating the solder paste 36 on the pad 32; and (d) continuing to direct the laser energy beam 42 at the heatspreader/pad 14/32 for a second predetermined length of time while simultaneously feeding a predetermined amount of flux-core wire solder 50 into the laser energy beam 42 proximate the heatspreader 14, such that the wire solder 50 melts and flows onto at least one of the heatspreader 14 and the heatspreader mounting pad 32.

5 Claims, 2 Drawing Sheets

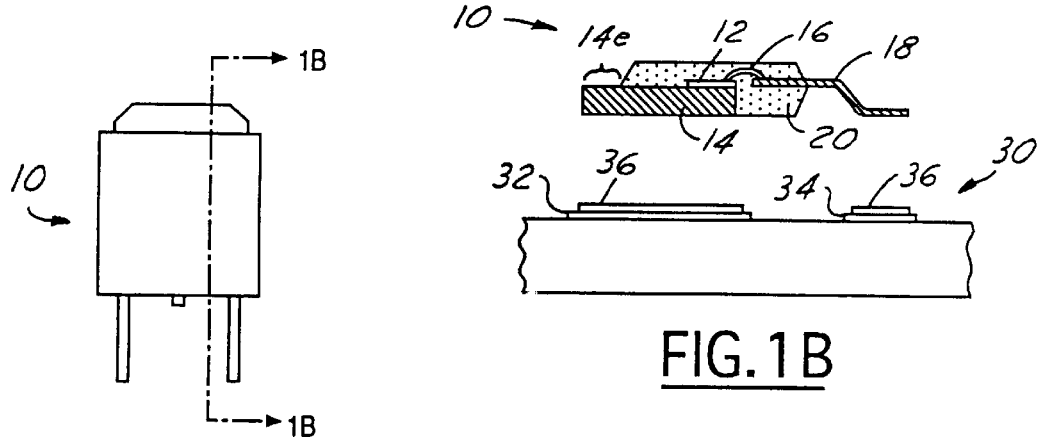
FIG. 1A
FIG. 1B
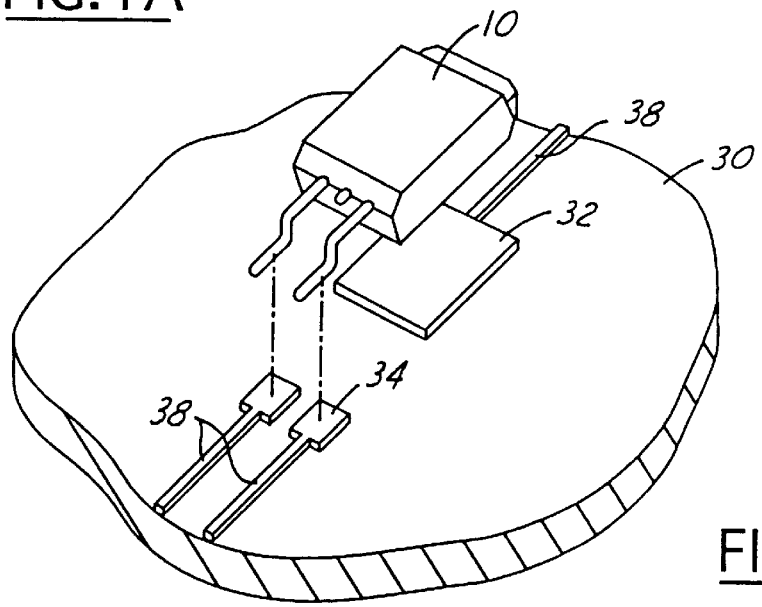
FIG. 1C
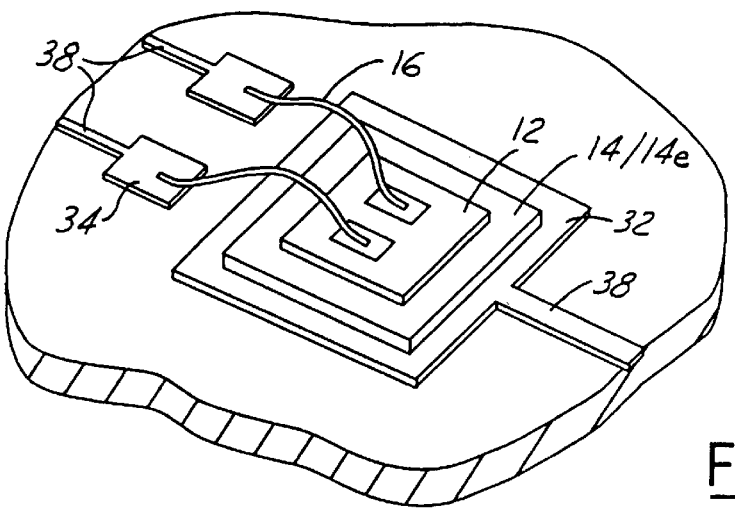
FIG. 2

METHOD FOR SOLDERING DPAK-TYPE ELECTRONIC COMPONENTS TO CIRCUIT BOARDS

BACKGROUND OF THE INVENTION

1. Field of the Invention

The present invention relates generally to soldering electronic components to circuit boards, and more particularly to a method for soldering DPAK-type electronic components to circuit boards.

2. Disclosure Information

DPAKs are relatively high-power electronic switching devices (e.g., transistors) that are commonly used on circuit boards. As illustrated in FIGS. 1A–C, a typical DPAK 10 includes an integrated circuit die 12 attached atop a heatspreader 14, with one or more selected sites on the top surface of the die wirebonded 16 to a like number of leads 18, and with a plastic or ceramic molded housing 20 encasing the die 12, the wirebond wires 16, a portion of the lead(s) 18, and a portion of the heatspreader 14.

A typical DPAK has two leads 18, but other DPAK-type components 10 may have one lead (e.g., a diode), three leads, and so forth. Typically the heatspreader 14 itself serves as an electrical interconnect, such as in transistor DPAKs where the heatspreader 14 is electrically connected to the base of the transistor die 12. (Usually the bottom surface of a transistor die serves as the base interconnect point, with the emitter and collector interconnect points being situated on the top surface of the die.)

As illustrated in FIG. 1B, DPAK-type components 10 are electrically and mechanically connected to circuit boards 30 by applying solder paste 36 to the heatspreader/lead mounting pads 32/34, positioning the component 10 with its heatspreader 14 and leads 18 resting atop their respective solder-pasted pads 32/34, and sending the component/board combination through a conventional reflow oven. For most types of electronic components, reflow soldering is an efficient and effective way of forming robust solder joints connecting a component's leads/terminations/etc. to their corresponding mounting pads.

However, conventional reflow soldering is not as effective at forming robust solder joints on DPAK-type components 10. Because the heatspreader 14 of a DPAK-type component is so large, it is often difficult to provide enough thermal energy to such components during reflow to melt all of the solder paste 36 sandwiched between the heatspreader 14 and its mounting pad 32. One approach for alleviating this problem is to simply increase the reflow oven peak temperature and/or increase the circuit board's exposure time to the peak temperature, but this approach has the drawback of risking damage to other components and/or to the substrate. Another approach is to use a laser rather than a reflow oven to solder the components. In laser soldering, a laser beam is directed at the component leads, terminations, exposed heatspreader portion, and/or the heatspreader mounting pad 32, so as to melt the solder paste 36 on the pad 32. However, as with reflow soldering, the heatspreader 14 of a DPAK-type component 10 is often too large to permit robust solder joint formation, even if a high laser power setting and long laser time are used.

In both of the foregoing approaches, it is often the case that the solder paste 36 immediately adjacent the exposed portion 14e of the heatspreader is the only portion thereof that gets melted. This results in a solder joint that forms only proximate the exposed portion 14e of the heatspreader, with no joint being formed underneath the component.

It would be desirable, therefore, to provide a way of soldering DPAK-type components to circuit boards without the aforementioned drawbacks.

SUMMARY OF THE INVENTION

The present invention overcomes the disadvantages of the prior art approaches by providing a method for soldering an electronic component having a heatspreader on a bottom surface thereof and at least one lead (e.g., a DPAK-type component) to a circuit board having a heatspreader mounting pad and at least one lead mounting pad, comprising the steps of: (a) depositing solder paste on the heatspreader mounting pad and on each of the at least one lead mounting pad; (b) placing the electronic component on the circuit board such that the heatspreader rests atop the heatspreader mounting pad and each lead rests atop a respective one of the at least one lead mounting pad; (c) directing a laser energy beam from a diode laser at the heatspreader and/or heatspreader pad for a first predetermined length of time, thereby heating the solder paste on the heatspreader mounting pad; and (d) continuing to direct the laser energy beam at the heatspreader and/or heatspreader pad for a second predetermined length of time while simultaneously feeding a predetermined amount of flux-core wire solder into the laser energy beam proximate the heatspreader, such that the wire solder melts and flows onto at least one of the heatspreader and the heatspreader mounting pad.

It is an object and advantage that the method of the present invention is effective at forming robust solder joints on DPAK-type electronic components.

Another advantage is that the method of the present invention may be used with low-melting-point substrate materials that cannot be exposed to the temperature profiles of conventional reflow soldering.

Yet another advantage is that the present invention may be easily utilized in conjunction with conventional laser soldering.

These and other advantages, features and objects of the invention will become apparent from the drawings, detailed description and claims which follow.

BRIEF DESCRIPTION OF THE DRAWINGS

FIGS. 1A–C are top, side section, and perspective views, respectively, of a typical DPAK electronic component.

FIG. 2 is a perspective view of an unpackaged bare die on a heatspreader.

DETAILED DESCRIPTION OF THE PREFERRED EMBODIMENTS

Figure 3:
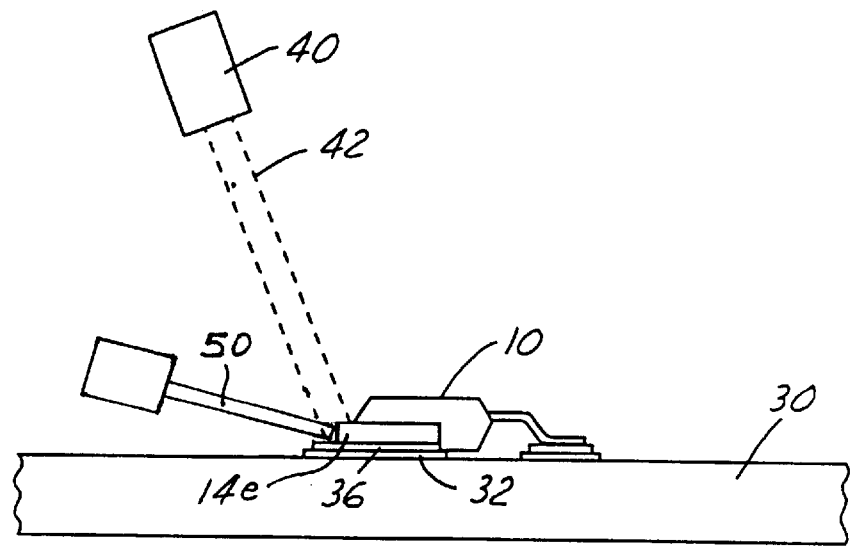
FIG. 3 is a side view of a DPAK-type electronic component being soldered to a circuit board using a diode laser beam and flux-core wire feed according to the present invention.
Figure 4:
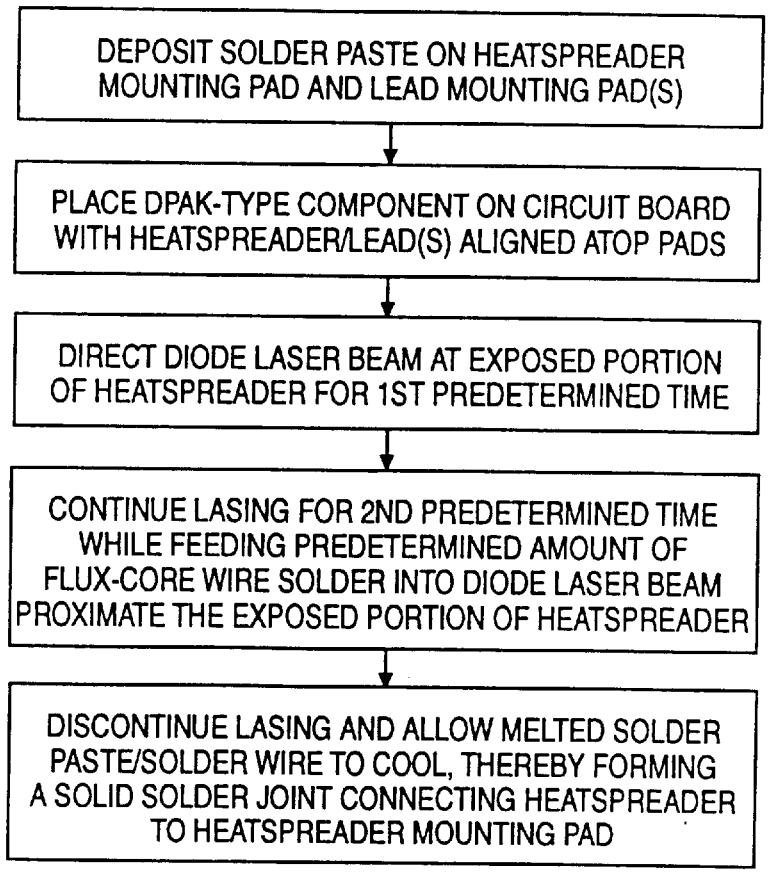
FIG. 4 is a schematic flowchart of the process steps of the present invention.

Referring now to the drawings, FIGS. 3–4 illustrate a method for soldering an electronic component 10 having a heatspreader 14 on a bottom surface thereof and at least one lead 18 (e.g., a DPAK-type component) to a circuit board 30 having a heatspreader mounting pad 32 and at least one lead mounting pad 34. The method comprises the steps of: (a) depositing solder paste 36 on the heatspreader mounting pad 32 and on each of the at least one lead mounting pad 34; (b) placing the electronic component 10 on the circuit board 30 such that the heatspreader 14 rests atop the heatspreader mounting pad 32 and each lead 18 rests atop a respective one of the at least one lead mounting pad 34; (c) directing a laser energy beam 42 from a diode laser 40 at the heatspreader 14 and/or heatspreader pad 32 for a first predetermined length of time, thereby heating the solder paste 36 on the heatspreader mounting pad 32; and (d) continuing to direct the laser energy beam 42 at the heatspreader/pad 14/32 for a second predetermined length of time while simultaneously feeding a predetermined amount of flux-core wire solder 50 into the laser energy beam 42 proximate the heatspreader 14, such that the wire solder 50 melts and flows onto at least one of the heatspreader 14 and the heatspreader mounting pad 32.

To assist the reader in understanding the present invention, all reference numbers used herein are summarized in the table below, along with the elements they represent:

10=DPAK-type electronic component
12=Integrated circuit die
14=Heatspreader
14e=Exposed portion of heatspreader
16=Wirebond wire
18=Lead
20=Molded housing
30=Circuit board
32=Heatspreader mounting pad
34=Lead mounting pad
36=Solder paste
38=Circuit trace
40=Diode laser
42=Laser energy beam from diode laser
50=Flux-core solder wire The electronic component 10 may be a DPAK, D2PAK, D3PAK, or any other DPAK-type component. As used herein, a "DPAK-type electronic component" includes any electronic component 10 which has a heatspreader 14 on a bottom surface thereof with the heatspreader being visible from above the component 10 when the component is situated on its respective mounting pads 32/34 on a circuit board 30. An example of such a component 10 is a common unpackaged bare die 12 that is bonded to a heatsink 14 and soldered to a circuit board mounting pad 32, whereupon one or more (typically-two) sites on the top die surface are wirebonded 16 to bond pads on the circuit board, as illustrated in FIG. 2. (This is essentially the same construction as a common DPAK, but without the plastic/ceramic housing 20 and with wirebond wires 16 wirebonded directly to the mounting pads 34 rather than being wirebonded to an intermediary leadframe 18.)

The circuit board 30 may be a rigid laminated polymer substrate (e.g., FR-4), a semi-rigid to rigid molded polymer substrate, a flexible polymer substrate (e.g., polyester), an etched tri-layer metallic circuit containing air bridges, or the like. The mounting pads 32/34 and circuit traces 38 may be applied using a traditional photoimaging, plating, and etching approach, or may be sputtered, vacuum deposited, or otherwise applied. As mentioned above, one advantage of the present invention is that the processing temperature to which the circuit board is exposed is much lower than with conventional reflow or laser soldering temperatures, thus permitting the use of low-melting-point polymers as the circuit board substrate material.

It is desirable to use a diode laser 40 as the energy source rather than other types of lasers (e.g., Nd:YAG) because of the 800–1000 nm frequency range of the laser beam 42 produced. Energy in this wavelength is readily absorbed by metals—such as the heatspreader 14, the heatspreader mounting pad 32, and the solder balls in the solder paste—but is not readily absorbed by most polymeric materials—such as the materials most commonly used to produce circuit board substrates 30—thus making the diode laser 40 a preferred energy source for electronic component soldering.

Once the solder paste 36 is deposited on the pads 32/34 and the component 10 has been positioned thereon, the laser energy beam 42 is directed at the exposed heatspreader portion 14e and/or at the heatspreader pad 32 for a first predetermined time. This time is calculated so as to be long enough to heat the solder paste 36 proximate the exposed heatspreader portion 14e to a temperature generally between the melting point of the solder paste and about 225° C. For example, for common eutectic tin-lead solder paste, this range would be generally between 183° C. and 225° C., and for a common DPAK component the first predetermined time would be about 7 seconds. Next, the beam 42 would continue to be directed at the exposed heatspreader portion and/or pad 14e/32 for a second predetermined time, while simultaneously feeding a predetermined length or amount of flux-core wire solder 50 into the beam 42 adjacent the exposed heatspreader portion 14e. This second predetermined time should be long enough to heat the solder paste 36 sandwiched between the heatspreader 14 and its mounting pad 32 to a temperature generally between about 200° C. and 240° C. For the example above, this second predetermined time would be about 5 seconds in duration.

Feeding the wire solder 50 into the beam 42 causes the wire solder to melt into liquid solder (e.g., molten tin-lead alloy) and liquid flux. It has been observed that the liquid solder tends to remain proximate the exposed heatspreader portion 14e (i.e., proximate the area where it was melted by the diode laser beam 42), while the liquid flux tends to quickly flow away from the exposed heatspreader portion 14e and underneath the rest of the heatspreader 14. This causes the heat to be given up by the hot liquid flux to the not-yet-melted solder paste 36 underneath the heatspreader 14, thereby urging the solder paste thereat to melt. Once the second predetermined time has elapsed, the laser beam 42 is turned off and the melted solder paste 36 and melted wire solder 50 are allowed to cool, thereby forming a solder joint connecting the heatspreader 14 to its mounting pad 32. Tests using the present method have indicated that substantially the entire bottom surface of the heatspreader 14 becomes soldered to the heatspreader mounting pad 32, with a robust metallurgical bond being formed therebetween. This represents a significant improvement over the prior art approaches for soldering DPAK-type components.

Another advantage of the present method is that commonly available flux-core wire solder may be used. Typical flux-core solder includes about 2 to 4% flux with the balance being solder metal. Typical diameters for such wire solder range from about 0.015 to 0.030 inches. The rate of wire feed for a common DPAK may range from about 1 to 25 mm/sec, with a typical solder wire volume of about 2 to 36 $mm^3$. For most applications, a diode laser power setting of 5 to 45 Watts is sufficient.

Various other modifications to the present invention may occur to those skilled in the art to which the present invention pertains. Other modifications not explicitly mentioned herein are also possible and within the scope of the present invention. It is the following claims, including all equivalents, which define the scope of the present invention.

What is claimed is:

1. A method for soldering an electronic component having a heatspreader on a bottom surface thereof and at least one lead to a circuit board with a heat sensitive substrate selected from the group consisting of rigid laminated polymer, semi-rigid to rigid molded polymer, and flexible polymer, having a heatspreader mounting pad and at least one lead mounting pad, wherein the heatspreader of the electronic component has an exposed portion thereof visible from above the component when the component is placed on the circuit board, comprising the steps of:

a. depositing solder paste on the heatspreader mounting pad and on each of the at least one lead mounting pad;

b. placing the electronic component on the circuit board such that the heatspreader rests atop the heatspreader mounting pad and each lead rests atop a respective one of the at least one lead mounting pad such that the electronic component obscures a major portion of the heatspreader mounting pad from the line of sight of a diode laser positioned above the component;

c. directing a laser energy beam from a diode laser for a first predetermined length of time at the exposed portion of the heatspreader and/or at the heatspreader mounting pad, thereby heating the solder paste on the heatspreader mounting pad to a temperature generally between the melting point of the solder and about 225 degrees C., so as not to damage the heat sensitive substrate thereat;

d. continuing to direct the laser energy beam at the heatspreader and/or heatspreader mounting pad for a second predetermined length of time while simultaneously feeding a predetermined amount of flux-core wire solder into the laser energy beam proximate the heatspreader, such that the wire solder flux melts and flows between the electronic component and the heatspreader mounting pad, thus heating the areas obscured from the diode laser's line of sight, thus allowing the wire solder to melt and flow onto at least one of the exposed portion of the heatspreader and the heatspreader mounting pad.

2. A method according to claim 1, further comprising the step of:

(e) allowing the solder paste and the melted wire solder to cool, thereby forming a solder joint connecting the heatspreader to the heatspreader mounting pad.

3. A method according to claim 1, wherein the predetermined amount of flux-core wire solder is generally about 2 to 36 mm$^3$.

4. A method according to claim 1, wherein the second predetermined length of time is long enough to heat the solder paste sandwiched between the heatspreader and the heatspreader mounting pad to a temperature generally between 200 and 240° C.

5. A method according to claim 1, wherein the electronic component is a DPAK-type component.

* * * * *